US008200209B2

(12) United States Patent
Pehrsson et al.

(10) Patent No.: US 8,200,209 B2
(45) Date of Patent: Jun. 12, 2012

(54) POWER CONSUMPTION DEBUGGING IN MOBILE TERMINALS

(75) Inventors: Göran Pehrsson, Malmö (SE); Anders Långberg, Trelleborg (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 1938 days.

(21) Appl. No.: 11/312,333

(22) Filed: Dec. 21, 2005

(65) Prior Publication Data

US 2006/0181560 A1 Aug. 17, 2006

Related U.S. Application Data

(60) Provisional application No. 60/653,299, filed on Feb. 16, 2005.

(51) Int. Cl.
H04W 24/00 (2009.01)
(52) U.S. Cl. ........ 455/423; 320/132; 320/133; 323/282; 714/32; 713/300; 455/572
(58) Field of Classification Search ...... 455/67.11–67.7, 455/423–425; 320/134, 149; 713/300–340
See application file for complete search history.

(56) References Cited

U.S. PATENT DOCUMENTS

| | | | |
|---|---|---|---|
| 5,047,961 A * | 9/1991 | Simonsen | 702/63 |
| 5,809,449 A | 9/1998 | Harper | |
| 5,838,139 A * | 11/1998 | Greene | 320/133 |
| 6,049,879 A | 4/2000 | Davis et al. | |
| 6,374,096 B1 * | 4/2002 | Parr | 455/226.1 |
| 6,553,240 B1 * | 4/2003 | Dervarics | 455/566 |
| 6,891,355 B2 * | 5/2005 | Kernahan | 323/282 |
| 7,016,710 B2 * | 3/2006 | Carmeli et al. | 455/574 |
| 7,050,829 B2 * | 5/2006 | Motohashi | 455/556.1 |
| 7,508,169 B2 * | 3/2009 | Miskovic et al. | 320/132 |
| 7,543,161 B2 * | 6/2009 | Olszewski et al. | 713/300 |
| 2002/0065049 A1 | 5/2002 | Chauvel et al. | |
| 2002/0195997 A1 | 12/2002 | Peek et al. | |
| 2003/0027608 A1 * | 2/2003 | Carmeli et al. | 455/574 |
| 2003/0073443 A1 * | 4/2003 | Bae et al. | 455/450 |
| 2003/0134632 A1 * | 7/2003 | Loughran | 455/423 |
| 2003/0191986 A1 * | 10/2003 | Cyran et al. | 714/32 |
| 2004/0098222 A1 | 5/2004 | Pehrsson et al. | |

(Continued)

FOREIGN PATENT DOCUMENTS

EP 0 854 583 A1 7/1998

(Continued)

OTHER PUBLICATIONS

PCT International Search Report, dated Jul. 6, 2006, in connection with International Application No. PCT/EP2006/001541.
PCT Written Opinion, dated Jul. 6, 2006, in connection with International Application No. PCT/EP2006/001541.

Primary Examiner — Nick Corsaro
Assistant Examiner — Gerald Johnson
(74) Attorney, Agent, or Firm — Potomac Patent Group PLLC

(57) ABSTRACT

Power consumption of an electronic device is measured by using circuitry within the electronic device to make power consumption measurements of the electronic device at predetermined time intervals. Each of the power consumption measurements is provided to a user of the device. This may involve incorporating each of the power consumption measurements in a debug printout generated by the electronic device. The measurements may be initiated by retrieving a parameter from a storage area within the electronic device, and initiating the power consumption measuring techniques in response to detecting that the retrieved parameter is in a predetermined state.

10 Claims, 2 Drawing Sheets

U.S. PATENT DOCUMENTS

| | | | |
|---|---|---|---|
| 2004/0204172 A1* | 10/2004 | Herle | 455/572 |
| 2005/0192063 A1* | 9/2005 | Brubacher-Cressman et al. | 455/574 |
| 2006/0046668 A1* | 3/2006 | Uratani et al. | 455/127.5 |
| 2006/0181560 A1* | 8/2006 | Pehrsson et al. | 347/14 |
| 2007/0066357 A1* | 3/2007 | Hollins et al. | 455/557 |

FOREIGN PATENT DOCUMENTS

| | | |
|---|---|---|
| EP | 1 494 110 A2 | 1/2005 |
| JP | 2000032673 | 1/2000 |

\* cited by examiner

POWER CONSUMPTION DEBUGGING IN MOBILE TERMINALS

CROSS REFERENCE TO RELATED APPLICATIONS

This application claims the benefit of U.S. Provisional Application No. 60/653,299, filed Feb. 16, 2005, which is hereby incorporated herein by reference in its entirety.

BACKGROUND

The present invention relates to mobile technology, and more particularly to methods and apparatuses for detecting power consumption of a mobile unit and correlating the detected power consumption with other detected conditions.

An increasing number of portable electronic devices are finding there way into the marketplace. Such devices typically rely on one or more batteries to supply power for their operation, and so power consumption of the device is an important aspect of the design.

The amount of power consumed by any given device can vary depending upon operating conditions. This is especially so for mobile communications equipment. It is therefore very important, when developing mobile terminals and mobile platforms, to monitor the amount of power being consumed by the device. This is true not only for steady state conditions when the mobile terminal is attached to a communications network, but also for other times such as when the mobile terminal is running an application.

Today external measuring devices are used for making power consumption measurements. Examples of such devices are multimeters, oscilloscopes and data acquisition equipment. The instrument vendors that make the power measurement devices usually provide application information explaining how to measure power consumption in mobile terminals. The measurement set-ups are often complicated to operate and measurement errors are easily introduced.

One goal of mobile terminal design is to achieve lower power consumption whenever possible. Most of the functionality for reducing power consumption in a mobile terminal is controlled by software. There are often errors related to this software control on all levels and in all phases of software development. Like any software, the software control for power reduction needs to be tested to enable design errors to be detected and then corrected. This "debugging" of the software is typically performed at a functional level by the programmer. However, verification of the power saving control is often neglected due to lack of measuring devices and because of the difficulties associated with obtaining proper measurement results.

Mobile terminals typically include a capability to generate debug printouts that inform about what the software is doing in real time. The software developers use these printouts when verifying the functionality.

Mobile terminals typically also include "fuel gauge" circuitry that is used for battery capacity estimation. This circuitry measures the electric charge going into and out of the battery. The accuracy for the measurements performed by the fuel gauge circuitry is often improved from one design to the next.

Mobile terminals also typically include a non-volatile memory. An area of this non-volatile memory is usually allocated for storing configuration and calibration parameters, the so-called Global Data (GD) parameters.

Existing solutions to the power consumption monitoring problem have a synchronization problem. Measurements are performed with separate external measuring devices. When comparing the measurements with the debug printouts from the terminal it is necessary to align the information in some way so that the measured power can be correlated with what the software was doing at the time. This is usually done manually by comparing the time stamps from the measurements with the time stamps in the debug printouts. Because of the large amount of information contained in the debug printouts, it is often very difficult to identify exactly which particular line of the printout is connected to for example a rise in power consumption.

Measuring the power consumption needs special equipment and is usually done in the lab area. Because of the cost of the equipment, it is not readily available for use by each individual software developer. The measurement equipment also usually requires certain skills in order to get accurate measurements.

Even if the problems of measurement equipment availability and correlation of power measurement results with debug printout information can be overcome, there is another problem in that it is difficult to perform power consumption measurements on a mobile terminal that is moving around in a network because the measurement devices are usually designed for stationary lab use. However, it is desirable to be able to take measurements on a mobile terminal that is moving around within a communications network because such measurements would be more representative of real-world conditions that include varying signal quality, as well as changing temperature and humidity conditions, all of which affect power usage.

When one organization is responsible for supplying a common mobile platform to a number of customers who independently use it as a basis for developing a final product, that organization is faced with the additional problem of comparing measurement results supplied by different mobile platform customers using a large variety of measurement setups.

U.S. Pat. No. 6,049,879 describes diagnostics to identify power consumption of devices present on a target terminal, such as a personal computer. In either an automatic or manual mode, the target terminal sets the devices to operate at defined power levels and measures the power consumption of the device at that level. In a monitoring mode, the described arrangement permits a system operator to audit power state changes of devices in a target terminal during normal operation. This arrangement has drawbacks. For example, the taking of power measurements is tied to either a command that sets a known state within the terminal or a detected change of state within the terminal. Such techniques are not very useful for mobile terminals, however, because they fail to detect changes in power consumption that are associated with things such as temperature, hardware failure, network settings, electrical interference, humidity, and the like. In a complex system, the number of states and dependencies between states is enormous, making it effectively impossible to debug such a system by applying the techniques disclosed in U.S. Pat. No. 6,049,879.

EP 149411 describes systems and methods for profiling the power consumption of software instructions executing on a processor. A power measurement circuit records power consumption levels of a processor executing various software instructions. A profiling tool tracks and identifies the instructions being executed on the processor and generates an association between the instructions and the power consumed during execution of those instructions. Thus, the disclosed technique involves synchronizing power consumption measurements with the execution of instructions. For the same reasons stated above, such a technique is not useful for debugging complex systems such as a mobile terminal, in which changes in power consumption are not associated with parameters that can be controlled by the tester.

It is therefore desirable to provide power measurement methods and apparatuses that are applicable to a mobile terminal.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in methods and apparatuses that measure power consumption of an electronic device. In one aspect, this involves using circuitry within the electronic device to make power consumption measurements of the electronic device at predetermined time intervals. Each of the power consumption measurements is provided to a user of the device.

In another aspect, providing each of the power consumption measurements to a user of the device includes incorporating each of the power consumption measurements in a debug printout generated by the electronic device.

In some embodiments, using circuitry within the electronic device to make power consumption measurements of the electronic device involves detecting a voltage drop across a resistor that is in series with a power supply of the electronic device, and converting the detected voltage drop into a charge value. A number of charge values are then accumulated over a predetermined measurement time period. In still other embodiments, an average power consumption measurement is then generated by dividing the accumulated charge values by the measurement time period.

In yet another aspect, the taking of measurements is initiated by retrieving a parameter (e.g., an "enable flag") from a storage area within the electronic device, and initiating the taking of power consumption measurements in response to detecting that the retrieved parameter is in a predetermined state.

In some embodiments, the electronic device is a mobile terminal.

BRIEF DESCRIPTION OF THE DRAWINGS

The objects and advantages of the invention will be understood by reading the following detailed description in conjunction with the drawings in which.

DETAILED DESCRIPTION

Figure 1:
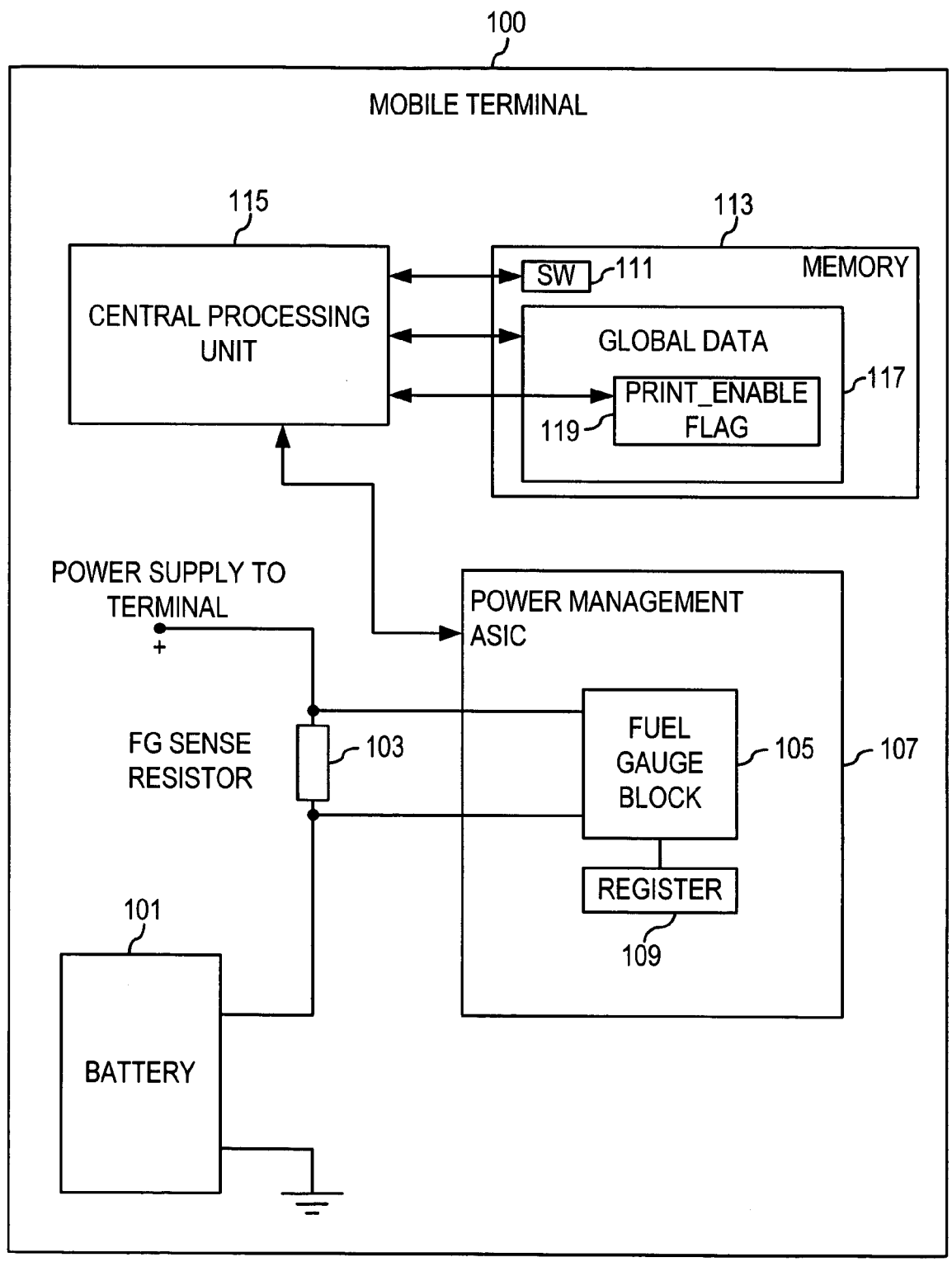
FIG. 1 is a schematic diagram of a mobile terminal incorporating aspects that are consistent with the invention.

The various features of the invention will now be described with reference to the figures, in which like parts are identified with the same reference characters.

The various aspects of the invention will now be described in greater detail in connection with a number of exemplary embodiments. To facilitate an understanding of the invention, many aspects of the invention are described in terms of sequences of actions to be performed by elements of a computer system or other hardware capable of executing programmed instructions. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention. For each of the various aspects of the invention, any such form of embodiments may be referred to herein as "logic configured to" perform a described action, or alternatively as "logic that" performs a described action.

In one aspect of embodiments consistent with the invention, the fuel gauge block that is ordinarily included within a mobile terminal is also used as part of a debug tool for power consumption. This may be embodied, for example, in a power management Application Specific Integrated Circuit (ASIC) that is included within the mobile terminal.

In another aspect that enables power measurements to be performed even when the mobile terminal is moving around in its normal operating environment, operation of the debug tool is enabled by setting a parameter in the global data area of storage within the mobile terminal. This makes it easily possible to debug power consumption on all software labels/releases and on all products (reference design or customer products) and also during all phases of development.

In yet another aspect of embodiments consistent with the invention, enabling the debug tool causes the fuel gauge block to be always active, gathering information about the mobile terminal's power consumption in real time. Measurement results are obtained periodically, rather than based on known state changes. These periodic measurements are then advantageously added to existing debug printouts. Accurate knowledge of the timing of the power consumption changes makes it easier to correlate changes with external interactions (e.g., with a network). The power consumption printouts are in this way synchronized to the other debug printouts thus making it possible to determine how different operating conditions and/or software modes/states affect the power consumption.

These and other aspects will now be described in greater detail in connection with exemplary embodiments. FIG. 1 is a schematic diagram of a mobile terminal 100 incorporating aspects that are consistent with the invention. For the sake of clarity, elements not associated with power consumption are omitted from the figure. It will be understood, however, that the mobile terminal 100 additionally includes other elements necessary for other aspects of its operation.

A battery 101 supplies power to the mobile terminal 100. In series with the battery 101 is a sense resistor 103. (In alternative embodiments, the sense resistor 103 could be placed elsewhere, such as in the ground path.) The voltage drop across the sense resistor 103 is indicative of power usage within the mobile terminal 100. A fuel gauge block 105 has leads connected to respective terminals of the sense resistor 103 in order to be able to sense the voltage drop across the sense resistor 103. The fuel gauge block 105 includes logic that, among other things, enables it to convert the voltage over the sense resistor 103 into a charge value.

In some embodiments, the fuel gauge block 105 is advantageously located within a power management ASIC 107. The power management ASIC 107 further includes logic (not shown) that coordinates/operates the various elements in accordance with aspects described herein.

The power management ASIC 107 further includes a register 109, which is controlled so as to accumulate the charge value supplied by the fuel gauge block 105. Software (SW) 111 stored in a memory 117 and executed by the mobile terminal's central processing unit (CPU) 115 causes the accumulated charge value to be read out at periodic intervals. These readings are then included in a debug printout. The following is one of many possible examples of what a debug printout can look like:

| | |
|---|---|
| (02:55.985735) 43277 | MPH S 781 1 40 −694 −3 −12 3072 |
| (02:56.103216) 43304 | TL_Counter 6 CDT_Counter 4 |
| (02:56.106023) 43305 | MPH Serving |
| (02:56.108092) 779 −83 | 28 28 |
| (02:56.109473) MPH | TopList |
| (02:56.110483) 43305 | 781 −100 11 11 559 = 7000 a |
| (02:56.115364) 43306 | 40 −105 x x 512 30 9 |
| (02:56.118335) 43306 | 783 −114 x x 512 30 5 |
| (02:56.121957) 43307 | Current 3.0 mA |
| (02:56.122649) 43307 | 0 |
| (02:56.124025) 43307 | 0 |
| (02:56.124720) 43307 | + |
| (02:56.405432) 43382 | MPH S 40 −3 22 −1606 −11 −3 2756 |
| (02:57.017603) 43532 | MPH B 779 0 0 0 0 0 0 |
| (02:57.020409) 43533 | |
| si13:01060080005847EB4A9143A6285F2B2B2B2B2B2B2B2B2B2B | |
| (02:57.035681) 43535 | RR Non_DRX = 4 |
| (02:57.037750) 43535 | GPRS Cell options T3168_v = 1 |
| (02:57.041207) 43535 | MPH_PACKET_SYSTEM_INFO_REQ |
| (02:57.043970) 43536 | SI13 |
| (02:57.045349) 43536 | + |
| (02:57.553805) 43669 | MPH B 40 Not ok, TC = 6 |
| (02:58.915963) 44010 | +++ |
| (03:01.121957) 44307 | Current 2.9 mA |
| (03:03.165229) 45069 | TL_Counter 6 CDT_Counter 4 |
| (03:03.167973) 45070 | MPH Serving |
| (03:03.170044) 779 −81 | 30 30 |

In this example, two of the entries indicate how much current is being consumed (i.e., one indicating 3.0 mA, and another indicating 2.9 mA). The measurement period in this example is 5s, but this could of course be shorter or longer in other embodiments. In other embodiments, the power consumption and corresponding timestamps are not included with the list of other information, but are instead provided in a separate listing.

As better designs for the fuel gauge continuously become available, more accurate power measurements can be obtained, assuming that the readout period remains the same as before. Alternatively, improved fuel gauge circuitry will enable better time resolution (i.e., more frequent measurements) can be obtained while maintaining present levels of accuracy.

The mobile terminal 100 includes a global data storage area 117. In this exemplary embodiment, the global data storage area 117 is located within the memory 113, but in alternative embodiments it can be implemented as a separate memory. In another aspect, the global data storage area 117 includes storage of a Print_Enable parameter 119, which enables or disables operation of the power consumption debug printout. The global data storage area 117 is typically made accessible by using an embodiment-dependent PC tool provided to developers. Setting the Print_Enable parameter 119 to its "enable" state preferably does not affect either hardware or other software that is co-located within the mobile terminal 100.

Figure 2:
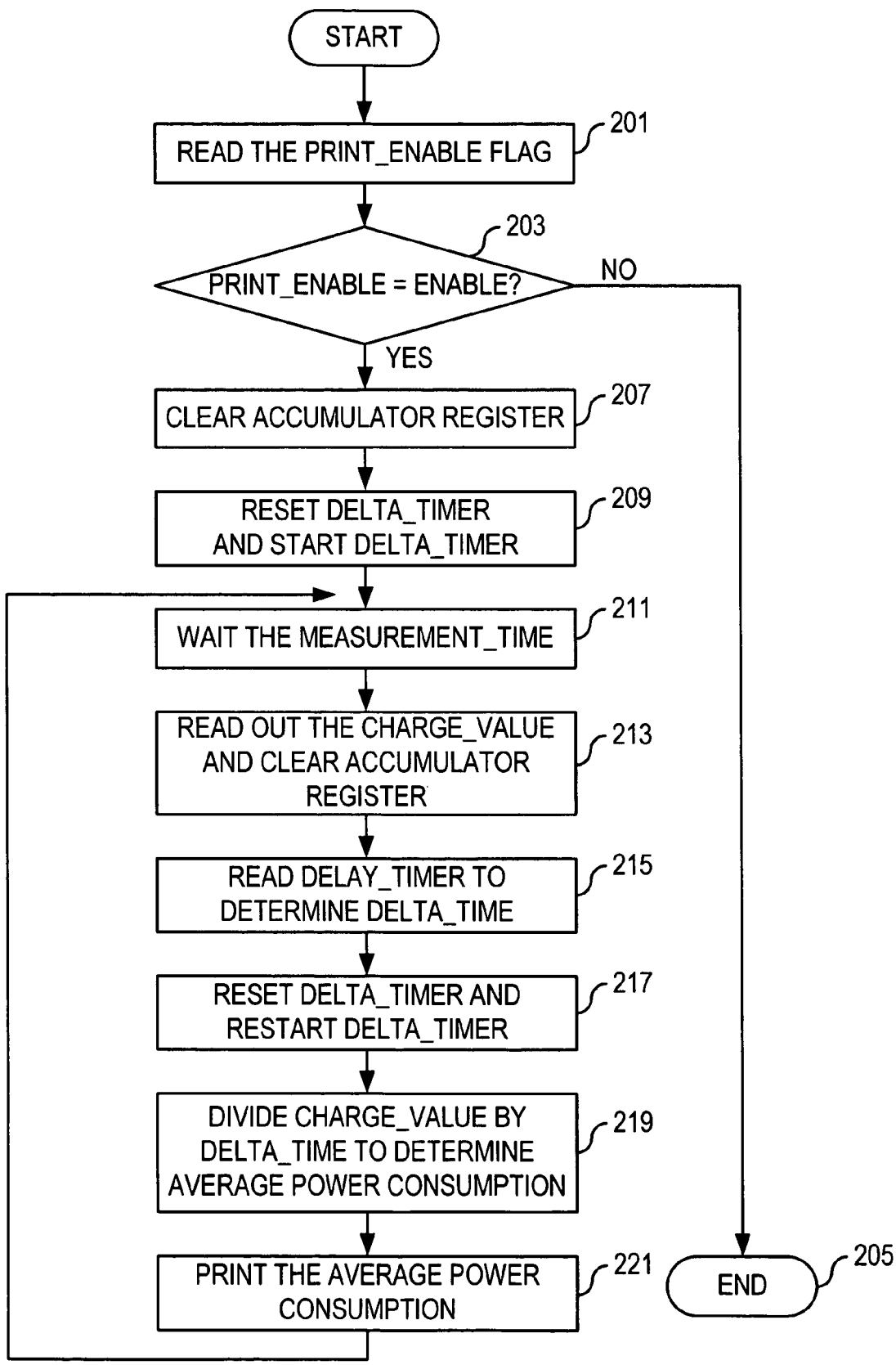
FIG. 2 is a flowchart of exemplary steps/processes that are carried out in embodiments that are consistent with the invention.

FIG. 2 is a flowchart of exemplary steps/processes that are carried out in embodiments that are consistent with the invention. In this exemplary embodiment, the processes/steps illustrated in FIG. 2 are carried out by the CPU 115. This exemplary embodiment begins by reading the Print_Enable parameter 119 (also may be implemented as a Print_Enable Flag) (step 201). The Print_Enable parameter 119 is then tested to determine whether power level debugging is enabled (decision block 203). If it is not ("NO" path out of decision block 203), then the routine ends (step 205).

If the Print_Enable parameter 119 indicates that power level debugging is enabled ("YES" path out of decision block 203), then the register 109 is cleared so that it will be ready to begin accumulating a next charge value.

The logic includes a timer (Delta_Timer) that determines the time between the readouts of the charge value. Following the readout and clearing of the register 109, the Delta_Timer is reset so that it will next timeout after a predetermined time interval, herein denoted Measurement_Time (step 209).

Next, the process waits the predetermined amount of time (Measurement_Time) (step 211). To facilitate a description of this embodiment, this step is illustrated as a "waiting" step. The Measurement_Time value represents the time resolution for the power consumption measurement. However, in practical embodiments, the routine can exit to permit the mobile unit to do other things. The occurrence of the timer interrupt causes the routine to resume processing at step 213.

At the end of the waiting period, the accumulated charge value is read from the fuel gauge block 105 and stored as the Charge_Value parameter (step 213). The present value of the Delta_Timer is then read to obtain a value, Delta_Time (step 215). After this reading, the Delta_Timer is reset and restarted (step 217). Measurement_Time represents the requested measurement period, whereas Delta_Time represents the actual period of time that elapsed since the previous measurement. These two values may differ from one another because of the inability to strictly control the timing of an interrupt driven routine.

An average power consumption measurement is then obtained by dividing the Charge_Value by the Delta_Time value just obtained (step 219). The Delta_Time value represents the time between readouts tracked with the Delta_Timer.

The average power consumption measurement is also printed out (step 221). This printout may, for example, be a separate printout supplied by the mobile terminal 100, or it may alternatively be merged with the printouts from other software debug applications. As used herein, the term "printout" is to be construed broadly to mean that information is made available for present and/or future reading/accessing by a user. This information could be conveyed on paper, but this is not necessary (e.g., "printing out" the information may merely mean storing it in a memory that a user may later access).

Following this step, execution jumps back to step 211 in order to repeat the process of periodically determining an average power consumption measurement and printing out this value. An embodiment such as the one illustrated in FIG. 2 could be designed to stop when the mobile terminal 100 is turned off. Powering on the mobile terminal 100 causes the Print_Enable parameter 119 to be checked, which will either re-start or skip the process, depending upon the state of the Print_Enable parameter 119. This aspect of the exemplary embodiment is not critical however; designers are free to design alternative embodiments having different starting and stopping conditions.

A number of benefits and advantages are obtained from the various features described herein. One of these is the ease with which the debug tool can be enabled for all software versions and releases on all products and on all levels in the development phase. This is made possible by the use of a global data value (e.g., the Print_Enable parameter 119) which can easily be switched from one state to another.

Another advantage is that the power consumption figures can be shown in real time directly in the debug printouts and thus synchronized with the ordinary printouts.

Yet another advantage is that no external equipment is needed to make these measurements and provide the information to the person doing the debugging. Each individual software developer can use the debug tool without having any special measurement set-up and without having the risk for measurement errors.

Another significant advantage is that it is easy to perform power consumption measurements on a mobile terminal that is moving around within a network.

To the maker of mobile platforms for others to independently use as a basis for developing a final product, another advantage is the ability to compare the mobile platform maker's own measurement results with those of the final developers because they use the same measurement equipment (e.g., the fuel gauge block 105 or power management ASIC 107).

The invention has been described with reference to particular embodiments. However, it will be readily apparent to those skilled in the art that it is possible to embody the invention in specific forms other than those of the embodiment described above. The described embodiments are merely illustrative and should not be considered restrictive in any way. The scope of the invention is given by the appended claims, rather than the preceding description, and all variations and equivalents which fall within the range of the claims are intended to be embraced therein.

What is claimed is:

1. A method of indicating power consumption of an electronic device, the method comprising:
    using circuitry within the electronic device to make power consumption-indicating measurements of the electronic device at predetermined time intervals; and
    providing each of the power consumption-indicating measurements to a user of the device,
    wherein providing each of the power consumption-indicating measurements to a user of the device comprises incorporating each of the power consumption-indicating measurements in a debug printout generated by the electronic device, wherein the debug printout includes information that indicates one or more software modes/states of the electronic device at one or more points in time,
    wherein incorporating each of the power consumption-indicating measurements in the debug printout generated by the device comprises incorporating the power consumption-indicating measurements at respective locations of the debug printout that correspond to respective measurement times of the power consumption-indicating measurements to thereby synchronize the power consumption-indicating measurements with the information that indicates the one or more software modes/states of the electronic device at one or more points in time.

2. The method of claim 1, wherein using circuitry within the electronic device to make power consumption-indicating measurements of the electronic device comprises: the
    detecting a voltage drop across a resistor that is in series with a power supply of the electronic device;
    converting the detected voltage drop into a charge value; and
    accumulating a number of charge values over a predetermined measurement time period.

3. The method of claim 2, comprising: generating an average power consumption measurement by dividing the accumulated charge values by the measurement time period.

4. The method of claim 1, comprising:
    retrieving a parameter from a storage area within the electronic device; and
    initiating the current consumption measuring method in response to detecting that the retrieved parameter is in a predetermined state.

5. The method of claim 1, wherein the electronic device is a mobile terminal.

6. An apparatus for measuring current consumption of an electronic device, the apparatus comprising:
    logic circuitry within the electronic device that makes current consumption measurements of the electronic device at predetermined time intervals; and
    logic circuitry that provides each of the current consumption measurements to a user of the device,
    wherein the logic circuitry that provides each of the current consumption measurements to a user of the device comprises logic circuitry that incorporates each of the current consumption measurements in a debug printout generated by the electronic device, wherein the debug printout includes information that indicates one or more software modes/states of the electronic device at one or more points in time,
    wherein the logic circuitry that incorporates each of the power consumption-indicating measurements in the debug printout generated by the device comprises logic circuitry that incorporates the power consumption-indicating measurements at respective locations of the debug printout that correspond to respective measurement times of the power consumption-indicating measurements to thereby synchronize the power consumption-indicating measurements with the information that indicates the one or more software modes/states of the electronic device at one or more points in time.

7. The apparatus of claim 6, wherein the logic circuitry within the electronic device that makes current consumption measurements of the electronic device comprises:
    logic circuitry that detects a voltage drop across a resistor that is in series with a power supply of the electronic device;
    logic circuitry that converts the detected voltage drop into a charge value; and
    logic circuitry that accumulates a number of charge values over a predetermined measurement time period.

8. The apparatus of claim 7, comprising:
    logic circuitry that generates an average current consumption measurement by dividing the accumulated charge values by the measurement time period.

9. The apparatus of claim 6, comprising:
    logic circuitry that retrieves a parameter from a storage area within the electronic device; and
    logic circuitry that initiates the current consumption measuring method in response to detecting that the retrieved parameter is in a predetermined state.

10. The apparatus of claim 6, wherein the electronic device is a mobile terminal.

\* \* \* \* \*

UNITED STATES PATENT AND TRADEMARK OFFICE
CERTIFICATE OF CORRECTION

PATENT NO. : 8,200,209 B2
APPLICATION NO. : 11/312333
DATED : June 12, 2012
INVENTOR(S) : Pehrsson et al.

It is certified that error appears in the above-identified patent and that said Letters Patent is hereby corrected as shown below:

In Column 1, Line 18, delete "there" and insert -- their --, therefor.

In Column 7, Line 65, in Claim 2, delete "comprises: the" and insert -- comprising: --, therefor.

In Column 8, Line 45, in Claim 7, delete "comprises:" and insert -- comprising: --, therefor.

Signed and Sealed this
Nineteenth Day of February, 2013

Teresa Stanek Rea
*Acting Director of the United States Patent and Trademark Office*